(12) United States Patent
Kim et al.

(10) Patent No.: US 9,929,322 B2
(45) Date of Patent: *Mar. 27, 2018

(54) FOLDABLE ORGANIC LIGHT EMITTING DISPLAY DEVICE

(71) Applicant: LG Display Co., Ltd., Seoul (KR)

(72) Inventors: Ji-Min Kim, Seoul (KR); Sang-Hoon Oh, Jeollabuk-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/589,693

(22) Filed: May 8, 2017

(65) Prior Publication Data

US 2017/0244065 A1    Aug. 24, 2017

Related U.S. Application Data

(63) Continuation of application No. 14/967,026, filed on Dec. 11, 2015, now Pat. No. 9,680,128.

(30) Foreign Application Priority Data

Jul. 31, 2015 (KR) ........................ 10-2015-0108716

(51) Int. Cl.
*H01L 33/52* (2010.01)
*H01L 51/52* (2006.01)
*H01L 51/00* (2006.01)
*H01L 33/56* (2010.01)
*H01L 33/54* (2010.01)
*H01L 27/32* (2006.01)

(52) U.S. Cl.
CPC .............. *H01L 33/52* (2013.01); *H01L 33/54* (2013.01); *H01L 33/56* (2013.01); *H01L 51/0097* (2013.01); *H01L 51/5253* (2013.01); *H01L 27/32* (2013.01); *H01L 27/3211* (2013.01); *H01L 2251/5338* (2013.01)

(58) Field of Classification Search
CPC ..... H01L 27/32; H01L 27/3211; H01L 33/52; H01L 33/54; H01L 33/56
See application file for complete search history.

(56) References Cited

U.S. PATENT DOCUMENTS

| | | | |
|---|---|---|---|
| 9,680,128 B2* | 6/2017 | Kim | H01L 27/32 |
| 2012/0133275 A1* | 5/2012 | Lee | H01L 51/5256 313/506 |
| 2014/0027728 A1 | 1/2014 | Yoon et al. | |
| 2015/0155344 A1* | 6/2015 | Lee | H01L 51/5253 257/40 |
| 2016/0104859 A1* | 4/2016 | Kim | H01L 51/5228 257/40 |

OTHER PUBLICATIONS

United States Office Action, U.S. Appl. No. 14/967,026, filed Sep. 22, 2016, twelve pages.

* cited by examiner

*Primary Examiner* — Eduardo A Rodela

(74) *Attorney, Agent, or Firm* — Fenwick & West LLP

(57) ABSTRACT

A foldable organic light emitting display (OLED) device comprises a substrate including a display region and a non-display region, the non-display region located at a periphery of the display region; an emitting diode in the display region; and an encapsulation film covering both the emitting diode and an entirety of the display region, and the encapsulation film covering and a part of the non-display region without covering at least another part of the non-display region.

11 Claims, 10 Drawing Sheets

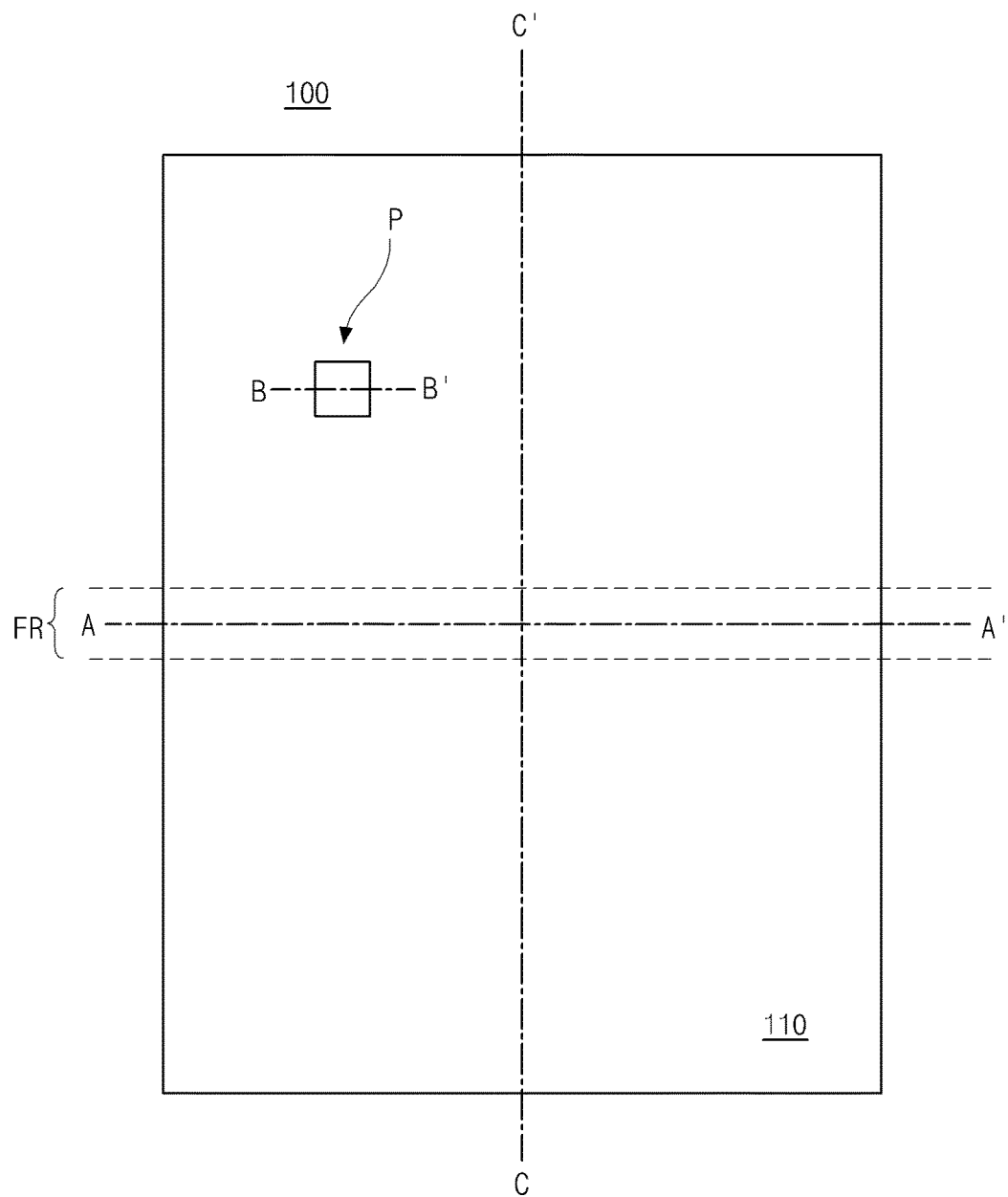

100

FR

200

200

300

300

400

ABLE ORGANIC LIGHT EMITTING
DISPLAY DEVICE

CROSS-REFERENCE TO RELATED
APPLICATIONS

The present application is a continuation of U.S. patent application Ser. No. 14/967,026 filed on Dec. 11, 2015 which claims the benefit of Korean Patent Application No. 10-2015-0108716 filed in the Republic of Korea on Jul. 31, 2015, each of which is hereby incorporated by reference in its entirety.

BACKGROUND

Field of Technology

The present disclosure relates to an organic light emitting display (OLED) device and more particularly to a foldable OLED device that prevents being damaged by moisture.

Discussion of the Related Art

As information technology and mobile communication technology have been developed, a display device capable of displaying a visual image has also been developed. Flat panel display devices, such as a liquid crystal display (LCD) device and an OLED device, are developed and used.

Among these flat panel display devices, since the OLED device has advantages in response time, contrast ratio, viewing angle, power consumption, and so on, the OLED device is widely developed.

An emitting diode including an organic emitting layer is susceptible to damage from moisture. To prevent moisture penetration into the emitting diode and protect the emitting diode from external impacts, an encapsulation substrate of glass is attached onto the emitting diode.

Recently, foldable or bendable display devices (hereinafter "foldable display device") have been introduced.

In the foldable OLED device, an encapsulation film including an inorganic layer and an organic layer is used instead of the encapsulation substrate. Namely, by using the encapsulation film for preventing moisture penetration into the emitting diode and to protect the emitting diode, the display device has a foldable property.

However, when the foldable OLED device is operated under a condition of high temperature and high humidity, the emitting diode is damaged resulting in problems in display quality and a lifetime of the foldable OLED device.

SUMMARY

Accordingly, the present invention is directed to a foldable OLED device that substantially obviates one or more of the problems due to limitations and disadvantages of the related art.

An object of the present invention is to provide a foldable OLED device being capable of preventing damage by moisture.

Another object of the present invention is to provide a foldable OLED device having advantages in production costs.

Another object of the present invention is to provide a foldable OLED device having a narrow bezel.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a foldable organic light emitting display (OLED) device comprises a substrate including a display region and a non-display region, the non-display region located at a periphery of the display region; an emitting diode in the display region; and an encapsulation film covering both the emitting diode and an entirety of the display region, and the encapsulation film covering a part of the non-display region without covering at least another part of the non-display region.

In another aspect, a foldable organic light emitting display (OLED) device comprises a substrate including a folding region along a first direction in which the foldable device is foldable; an emitting diode on substrate; and an encapsulation film including a first inorganic layer covering the emitting diode, an organic layer on the first inorganic layer and a second inorganic layer on the organic layer, wherein in the first direction, the second inorganic layer is wider than the first inorganic layer and covers side surfaces of the first inorganic layer, and in a second direction that is perpendicular to the first direction, a width of the second inorganic layer is substantially the same as a width of the first inorganic layer.

In another aspect, a foldable organic light emitting display (OLED) device comprises a flexible substrate including a display region and a non-display region located at a periphery of the display region, the flexible substrate folded across a folding region that is along a first direction of the foldable OLED device; an emitting diode in the display region; and an encapsulation film covering both the emitting diode and an entirety of the display region, and the encapsulation film covering a part of the non-display region without covering at least another part of the non-display region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIG. 3A is a schematic plane view illustrating a foldable OLED device according to one embodiment of the present disclosure.

DETAILED DESCRIPTION

Reference will now be made in detail to the preferred embodiments, examples of which are illustrated in the accompanying drawings.

Figure 1:
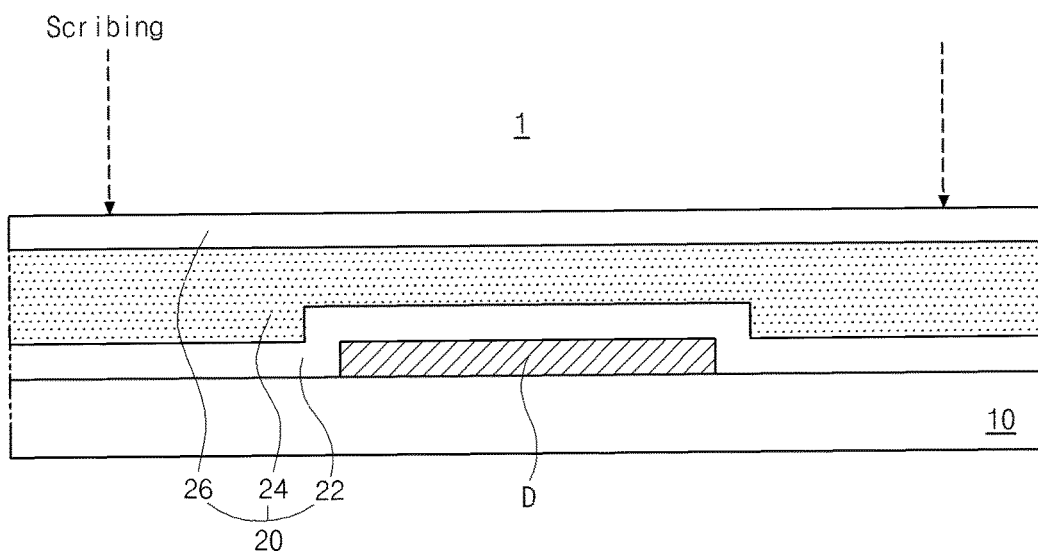
FIG. 1 is a schematic cross-sectional view illustrating a scribing process of a foldable OLED device.
Figure 2:
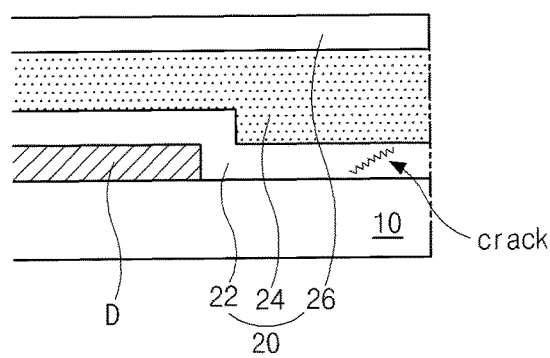
FIG. 2 is a schematic cross-sectional view illustrating damages in an encapsulation film of a foldable OLED device.

FIG. 1 is a schematic cross-sectional view illustrating a scribing process of a foldable OLED device, and FIG. 2 is a schematic cross-sectional view illustrating damages in an encapsulation film of a foldable OLED device.

As shown in FIGS. 1 and 2, an OLED device 1 includes a flexible substrate 10, an emitting diode D and an encapsulating film 20 covering the emitting diode D.

The flexible substrate 10 may include polymer such as polyimide, and the emitting diode D is formed on or over the flexible substrate 10.

Although not shown, the emitting diode D includes first and second electrodes facing each other and an organic emitting layer between the first and second electrodes. In addition, on the flexible substrate 10, a switching thin film transistor (TFT) as a switching element and a driving TFT as a driving element are formed, and the first electrode of the emitting diode D is connected to the driving TFT.

The encapsulating film 20 covers the emitting diode D to prevent damage to the emitting diode D under conditions of high temperature and high humidity.

In the encapsulation film 20, an inorganic layer and an organic layer are alternately stacked. For example, the encapsulation film 20 may have a triple-layered structure including a first inorganic layer 22 on the emitting diode D, an organic layer 24 on the first inorganic layer 22 and a second inorganic layer 26 on the organic layer 24.

A plurality of cells are formed on a mother substrate, and each cell is separated by a scribing process to provide the OLED device 1.

Namely, a plurality of emitting diodes D are formed in each cell, and the encapsulation film 20 is formed to cover an entire surface of the mother substrate. Then, the scribing process is performed to separate each cell.

Since the scribing process is performed onto the encapsulation film 20, the encapsulation film 20 is damaged. Namely, cracks may be generated in the first inorganic layer 22 and the second inorganic layer 26, and moisture may penetrate into the emitting diode D through the cracks as shown in FIG. 2. As a result, the emitting diode D may be damaged.

In the foldable OLED device, stress by folding operation is concentrated into the encapsulation film 20 in a folding region. Accordingly, when damages, such as cracks, are generated in the encapsulation film 20 by the scribing process, the cracks can grow due to the folding operation causing further damage to the emitting diode D.

FIG. 3A is a schematic plane view illustrating a foldable OLED device according to one embodiment of the present disclosure.

As shown in FIG. 3, an OLED device 100 is a foldable OLED device capable of being folded along a folding region FR. For example, the folding region FR is defined along a direction of a minor axis of the foldable OLED device 100. Alternatively, the folding region FR may be defined along a direction of a major axis of the foldable OLED device 100.

When the folding region FR is defined along the direction of the minor axis of the foldable OLED device 100, a pad region (not shown) is defined in at least one end along the direction of the major axis.

In the foldable OLED device 100 of the present disclosure, a plurality of pixel regions P are defined on a flexible substrate 110, and an emitting diode (not shown) is formed in a display region including the plurality of pixel regions P. In addition, an encapsulating film covering the emitting diode is formed.

In the folding region FR, the encapsulation film has a width smaller than the flexible substrate 110. Namely, in the direction of the minor axis, both ends of the encapsulation film are positioned inside both ends of the flexible substrate 110. In addition, the end of the encapsulation film in the folding region and the end of the encapsulation film along a direction, which crosses the folding region, may have a symmetric structure or an asymmetric structure.

Figure 3B:
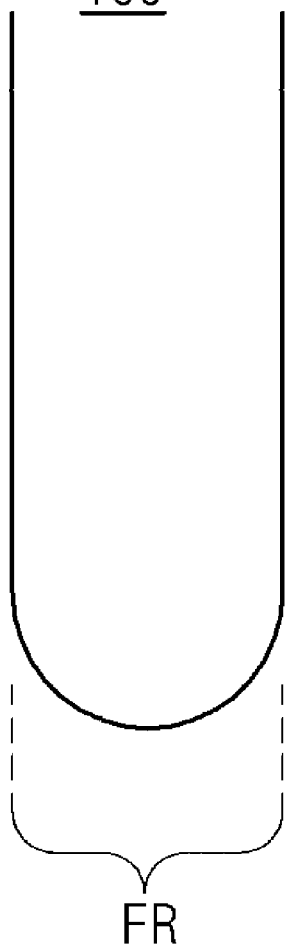
FIG. 3B is a view of the foldable OLED device folded across the folding region according to one embodiment of the present disclosure.

Due to the encapsulation film, damages on the encapsulation film from the scribing process and the folding operation are prevented such that the problem of the display quality and the lifetime in the foldable OLED device 100 is overcome. FIG. 3B is a view of the foldable OLED device 100 folded across the folding region FR shown in FIG. 3A.

Figure 4A:
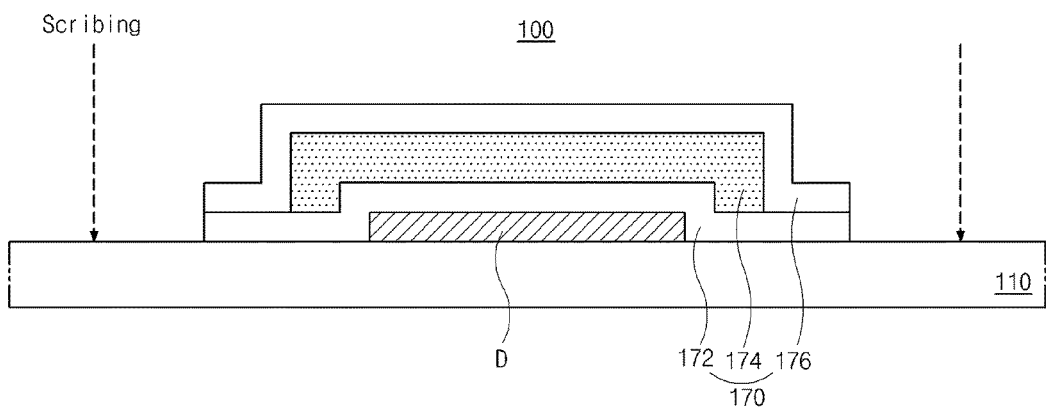
FIGS. 4A and 4B are schematic cross-sectional views illustrating a foldable OLED device according to a first embodiment of the present disclosure.
Figure 4B:
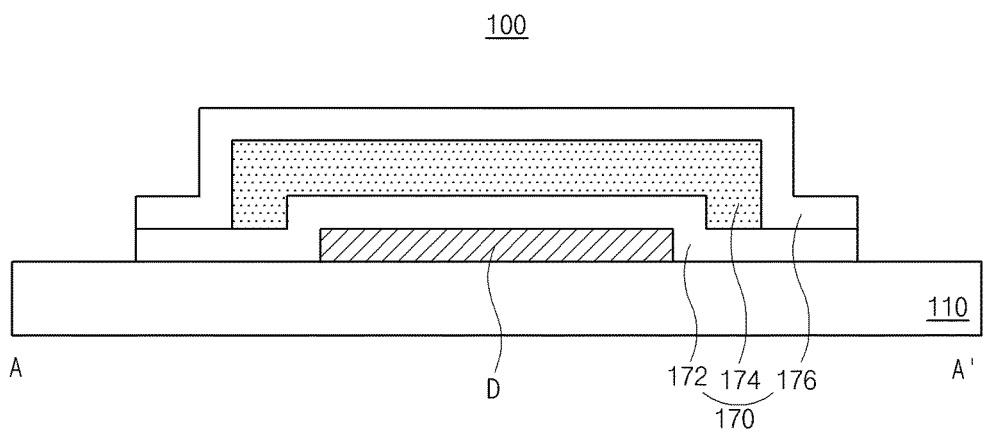
Figure 5:
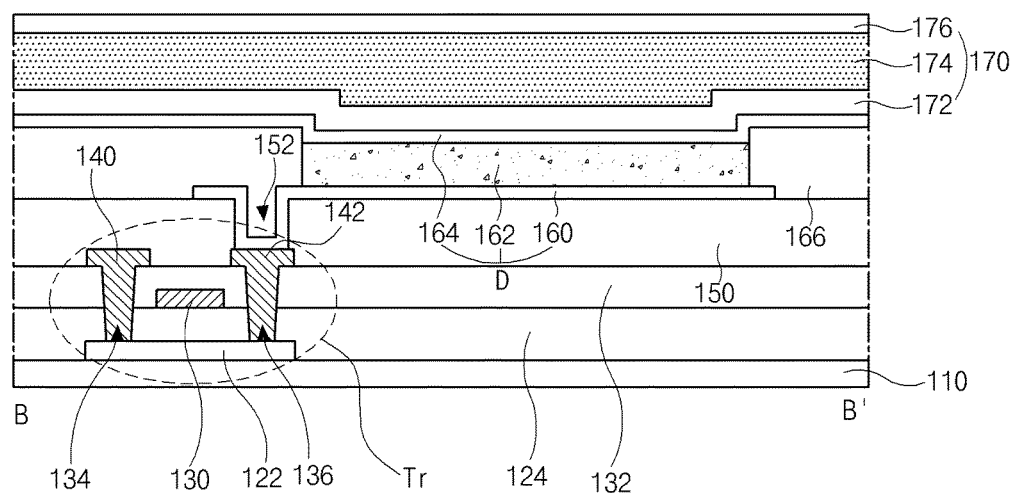
FIG. 5 is a schematic cross-sectional view illustrating a pixel structure of a foldable OLED device of the present disclosure.

FIGS. 4A and 4B are schematic cross-sectional views illustrating a foldable OLED device according to a first embodiment of the present disclosure, and FIG. 5 is a schematic cross-sectional view illustrating a pixel structure of a foldable OLED device of the present disclosure. FIG. 4B is a cross-sectional view taken along the line A-A' in FIG. 3, and FIG. 5 is a cross-sectional view taken along the line B-B' in FIG. 3.

As shown in FIG. 4A, an emitting diode D is formed to correspond to a display region of each cell in a mother substrate (not shown), and an encapsulation film 170 is formed to cover the emitting diode D and correspond to the display region and a part of a non-display region at peripheries of the display region.

Next, a scribing process is performed to separate each cell such that the flexible OLED device 100 is fabricated.

Since ends of the encapsulation film 170 are positioned inside scribing lines, the scribing process is not performed to the encapsulation film 170. Accordingly, the damages, such as cracks, are not generated in the encapsulation film 170 in the scribing process.

As shown in FIG. 4B, the flexible OLED device 100 fabricated by the above scribing process includes the flexible substrate 110, where the display region and the non-display region are defined, the emitting diode D corresponding to the display region and disposed on or over the flexible substrate 110, and the encapsulation film 170 covering the emitting diode D and corresponding to the display region and a part of the non-display region.

Referring to FIG. 5, a TFT Tr, the emitting diode D, and the encapsulation film 170 are sequentially stacked on the flexible substrate 110.

For example, the flexible substrate 110 may be a polyimide substrate. Since the flexible substrate 110 is inadequate to a process of forming elements, such as the TFT Tr, the process of forming the elements is performed on the flexible substrate 110 attached to a carrier substrate (not shown) such as a glass substrate. After the process of forming the elements, the carrier substrate and the flexible substrate 110 is separated or released.

The TFT Tr is formed on the flexible substrate 110. Although not shown, a buffer layer may be formed on the flexible substrate 110, and the TFT Tr may be formed on the buffer layer.

A semiconductor layer 122 is formed on the flexible substrate 110. The semiconductor layer 122 may include an oxide semiconductor material or polycrystalline silicon.

When the semiconductor layer 122 includes the oxide semiconductor material, a light-shielding pattern (not shown) may be formed under the semiconductor layer 122. The light to the semiconductor layer 122 is shielded or blocked by the light-shielding pattern such that thermal degradation of the semiconductor layer 122 can be prevented. On the other hand, when the semiconductor layer 122 includes polycrystalline silicon, impurities may be doped into both sides of the semiconductor layer 122.

A gate insulating layer 124 is formed on the semiconductor layer 122. The gate insulating layer 124 may be formed of an inorganic insulating material such as silicon oxide or silicon nitride.

A gate electrode 130, which is formed of a conductive material, e.g., metal, is formed on the gate insulating layer 124. In one embodiment, the gate electrode 130 is formed at a location corresponding to a center of the semiconductor layer 122.

In FIG. 5, the gate insulating layer 124 is formed on the entire surface of the flexible substrate 110. Alternatively, the gate insulating layer 124 may be patterned to have the same shape as the gate electrode 130.

An interlayer insulating layer 132, which is formed of an insulating material, is formed on an entire surface of the flexible substrate 110 including the gate electrode 130. The interlayer insulating layer 132 may be formed of an inorganic insulating material, e.g., silicon oxide or silicon nitride, or an organic insulating material, e.g., benzocyclobutene or photo-acryl.

The interlayer insulating layer 132 includes a first contact hole 134 and a second contact hole 136 exposing both sides of the semiconductor layer 122. The first contact hole 134 and second contact hole 136 are positioned at both sides of the gate electrode 130 to be spaced apart from the gate electrode 130.

In FIG. 5, the first contact hole 134 and second contact hole 136 extend into the gate insulating layer 124. Alternatively, when the gate insulating layer 124 is patterned to have the same shape as the gate electrode 130, there may be no first contact hole 134 and second contact hole 136 in the gate insulating layer 124.

A source electrode 140 and a drain electrode 142, which are formed of a conductive material, e.g., metal, are formed on the interlayer insulating layer 132. The source electrode 140 and the drain electrode 142 are spaced apart from each other with respect to the gate electrode 130 and respectively contact both sides of the semiconductor layer 122 through the first and second contact holes 134 and 136.

The semiconductor layer 122, the gate electrode 130, the source electrode 140 and the drain electrode 142 constitute the TFT Tr, and the TFT Tr serves as a driving element.

In FIG. 5, the gate electrode 130, the source electrode 140 and the drain electrode 142 are positioned over the semiconductor layer 122. Namely, the TFT Tr has a coplanar structure.

Alternatively, in the TFT Tr, the gate electrode may be positioned under the semiconductor layer, and the source and drain electrodes may be positioned over the semiconductor layer such that the TFT Tr may have an inverted staggered structure. In this instance, the semiconductor layer may include amorphous silicon.

Although not shown, a gate line and a data line are disposed on or over the flexible substrate 110 and cross each other to define a pixel region. In addition, a switching element, which is electrically connected to the gate line and the data line, may be disposed on the flexible substrate 110. The switching element is electrically connected to the TFT Tr as the driving element.

In addition, a power line, which is parallel to and spaced apart from the gate line or the data line, may be formed on or over the flexible substrate 110. Moreover, a storage capacitor for maintaining a voltage of the gate electrode 130 of the TFT Tr during one frame, may be further formed on the flexible substrate 110.

A passivation layer 150, which includes a drain contact hole 152 exposing the drain electrode 142 of the TFT Tr, is formed to cover the TFT Tr.

A first electrode 160, which is connected to the drain electrode 142 of the TFT Tr through the drain contact hole 152, is separately formed in each pixel region. The first electrode 160 may be an anode and may be formed a conductive material having a relatively high work function. For example, the first electrode 160 may be formed of a transparent conductive material such as indium-tin-oxide (ITO) or indium-zinc-oxide (IZO).

When the flexible OLED device 100 is operated in a top-emission type, a reflection electrode or a reflection layer may be formed under the first electrode 160. For example, the reflection electrode or the reflection layer may be formed of aluminum-paladium-copper (APC) alloy.

A bank layer 166, which covers edges of the first electrode 160, is formed on the passivation layer 150. A center of the first electrode 160 in the pixel region is exposed through an opening of the bank layer 166.

An organic emitting layer 162 is formed on the first electrode 160. The organic emitting layer 162 may have a single-layered structure of an emitting material layer formed of an emitting material. Alternatively, to improve emitting efficiency, the organic emitting layer 162 may have a multi-layered structure including a hole injection layer, a hole transporting layer, the emitting material layer, an electron transporting layer and an electron injection layer sequentially stacked on the first electrode 160.

A second electrode 164 is formed over the flexible substrate 110 including the organic emitting layer 162. The second electrode 164 is positioned at an entire surface of the display area. The second electrode 164 may be a cathode and may be formed of a conductive material having a relatively low work function. For example, the second electrode 164 may be formed of aluminum (Al), magnesium (Mg) or Al—Mg alloy.

The first electrode 160, the organic emitting layer 162 and the second electrode 164 constitute the light emitting diode D.

An encapsulation film 170 is formed on the light emitting diode D to prevent moisture penetration into the light emitting diode D.

The encapsulation film 170 has a width smaller than the flexible substrate 110, and the ends of the encapsulation film 170 are positioned on the flexible substrate 110.

Namely, as shown in FIG. 4A, since the mother substrate including the encapsulation film 170, which has a smaller area than the cell, is scribed, the width of the encapsulation film 170 is smaller than that of the flexible substrate 110 such that the ends of the encapsulation film 170 are positioned inside the ends of the flexible substrate 110. As a result, the damages, such as cracks, in the encapsulation film by the scribing process are prevented.

In addition, since there is no encapsulation film 170 in the end of the folding region FR, the folding stress generated in the folding operation is not concentrated in the encapsulation film 170. Accordingly, the damages on the encapsulation film 170 by the folding operation is minimized or prevented.

In other words, in the ends of the folding region FR, the encapsulation film 170 is removed such that one of the passivation layer 150 (of FIG. 5), the interlayer insulating layer 132 (of FIG. 5), the gate insulating layer 124 (of FIG. 5) and the flexible substrate 110 is exposed and the ends of the encapsulation film 170 are disposed on the one of the passivation layer 150, the interlayer insulating layer 132, the gate insulating layer 124 and the flexible substrate 110.

On the other hand, to prevent the damages on the passivation layer 150, the interlayer insulating layer 132 or the gate insulating layer 124 by the scribing process and moisture penetration into the display region, all of the passivation layer 150, the interlayer insulating layer 132 and the gate insulating layer 124 may be removed in the ends of the folding region FR such that the encapsulation film 170 may contact the flexible substrate 110 in the ends of the folding region FR.

The encapsulation film 170 includes a first inorganic layer 172, an organic layer 174 and a second inorganic layer 176. However, it is not limited thereto.

For example, the encapsulation film 170 may further include an organic layer on the second inorganic layer 176 to have a quadruple-layered structure or may further include an organic layer and an inorganic layer on the second inorganic layer 176 to have a five-layered structure.

The first and second inorganic layers 172 and 176 have the same plane area and completely overlap each other. The organic layer 174 is positioned between the first and second inorganic layers 172 and 176. The organic layer 174 has a plane area smaller than the first and second inorganic layers 172 and 176 and completely overlaps the first and second inorganic layers 172 and 176. Namely, the organic layer 174 is completely covered and protected by the second inorganic layer 176 such that moisture penetration through the organic layer 174 is prevented.

For example, when the organic layer 174 has the same plane area as or larger area than the second inorganic layer 176, a side surface of the organic layer 174 is exposed and moisture penetration may be generated through the side surface of the organic layer 174. However, in the present disclosure, since the organic layer 174 is completely covered and protected by the second inorganic layer 176, moisture penetration through the organic layer 174 is prevented.

Each of the first inorganic layer 172 and second inorganic layer 176 may be formed of silicon oxide or silicon nitride, and the organic layer 174 may be formed of an epoxy compound or an acryl compound.

Although not shown, a barrier film may be attached to the encapsulation film 170, and a polarization plate for reducing an ambient light reflection may be attached to the barrier film. For example, the polarization plate may be a circular polarization plate.

As mentioned above, in the flexible OLED device 100 of the present disclosure, since the encapsulation film 170 is positioned inside the flexible substrate 110, the damages on the encapsulation film 170 by the scribing process are prevented.

In addition, since the ends of the encapsulation film 170 in the folding region FR are positioned inside the ends of the flexible substrate 110, the folding stress is not concentrated in the ends of the encapsulation film 170.

Accordingly, the decrease of the display quality and the lifetime in the flexible OLED device 100 generated by the damages on the elements, e.g., the emitting diode D, by the moisture penetration is minimized or prevented.

Figure 6A:
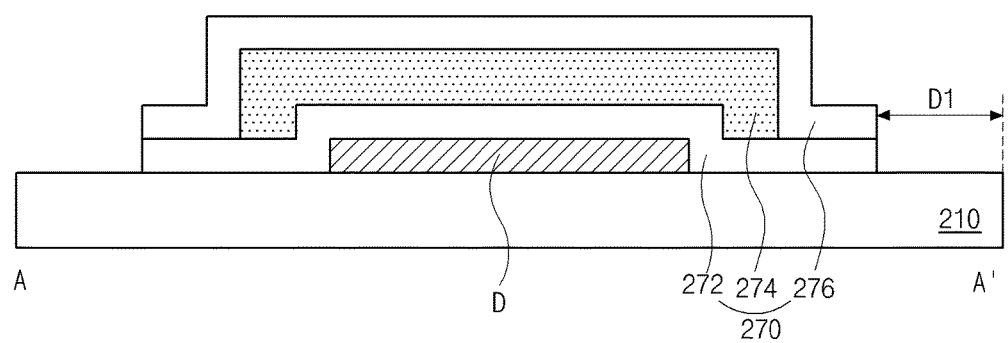
FIGS. 6A and 6B are schematic cross-sectional views illustrating a foldable OLED device according to a second embodiment of the present disclosure.
Figure 6B:
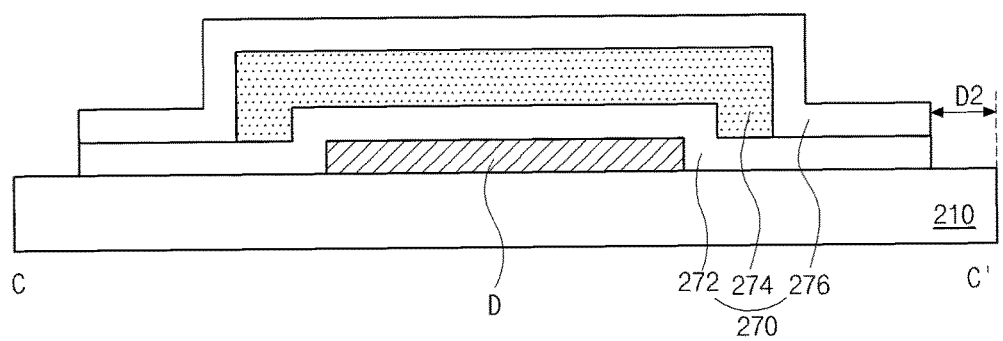

FIGS. 6A and 6B are schematic cross-sectional views illustrating a foldable OLED device according to a second embodiment of the present disclosure. FIG. 6A is a cross-sectional view taken along the line A-A' in FIG. 3, and FIG. 6B is a cross-sectional view taken along the line C-C' in FIG. 3.

As shown in FIGS. 6A and 6B, a flexible OLED device 200 according to the second embodiment of the present disclosure includes the flexible substrate 210, where the display region and the non-display region are defined, the emitting diode D corresponding to the display region and disposed on or over the flexible substrate 210, and the encapsulation film 270 covering the emitting diode D and corresponding to the display region and a part of the non-display region.

For example, the flexible substrate 210 may be a polyimide substrate. The TFT Tr (of FIG. 5), the emitting diode D and the encapsulation film 270 are formed on or over the flexible substrate 210.

As illustrated with FIG. 5, the TFT Tr may include the semiconductor layer 122, the gate electrode 130, the source electrode 140 and the drain electrode 142, and the emitting diode D may include the first electrode 160, which is connected to the drain electrode 142, the second electrode 164, which faces the first electrode 160, and the organic emitting layer 162 between the first and second electrodes 160 and 164.

The encapsulation film 270 covers the emitting diode D and has an area smaller than the flexible substrate 210. Namely, the ends of the encapsulation film 270 are positioned inside the ends of the flexible substrate 210.

In the ends of the folding region FR, the encapsulation film 270 is removed such that one of the passivation layer 150 (of FIG. 5), the interlayer insulating layer 132 (of FIG. 5), the gate insulating layer 124 (of FIG. 5) and the flexible substrate 210 is exposed and the ends of the encapsulation film 270 are disposed on the one of the passivation layer 150, the interlayer insulating layer 132, the gate insulating layer 124 and the flexible substrate 210.

On the other hand, to prevent the damages on the passivation layer 150, the interlayer insulating layer 132, or the gate insulating layer 124 by the scribing process and moisture penetration into the display region, all of the passivation layer 150, the interlayer insulating layer 132 and the gate insulating layer 124 may be removed in the ends of the folding region FR such that the encapsulation film 270 may contact the flexible substrate 210 in the ends of the folding region FR.

The encapsulation film 270 includes a first inorganic layer 272, an organic layer 274 and a second inorganic layer 276. However, it is not limited thereto.

For example, the encapsulation film 270 may further include an organic layer and an inorganic layer on the second inorganic layer 276 to have a five-layered structure.

The first and second inorganic layers 272 and 276 have the same plane area and completely overlap each other. The organic layer 274 is positioned between the first and second inorganic layers 272 and 276. The organic layer 274 has a plane area smaller than the first inorganic layer 272 and second inorganic layer 276 and completely overlaps the first inorganic layer 272 and second inorganic layer 276. Namely, the organic layer 274 is completely covered and protected by the second inorganic layer 276 such that moisture penetration through the organic layer 274 is prevented.

For example, when the organic layer 274 has the same plane area as or larger area than the second inorganic layer 276, a side surface of the organic layer 274 is exposed and moisture penetration may be generated through the side surface of the organic layer 274. However, in the present disclosure, since the organic layer 274 is completely covered and protected by the second inorganic layer 276, moisture penetration through the organic layer 274 is prevented.

Each of the first inorganic layer 272 and second inorganic layer may be formed of silicon oxide or silicon nitride, and the organic layer 274 may be formed of an epoxy compound or an acryl compound.

As shown in FIG. 6A, in the folding region FR, the end of the encapsulation film 270 has a first distance D1 from the flexible substrate 210.

On the other hand, as shown in FIG. 6B, in a side along a first direction, which is perpendicular to an extension direction (i.e., a second direction) of the folding region FR, the end of the encapsulation film 270 has a second distance D2, which is smaller than the first distance D1, from the flexible substrate 210.

Namely, the encapsulation film 270 has an asymmetric shape such that a distance between the end of the encapsulation film 270 and the end of the flexible substrate 210 is varied with respect to a direction.

In other words, in the second direction, where the ends of the folding region FR, in which the folding stress is generated, are disposed, the end of the encapsulation film 270 is positioned to be far away from the end of the flexible substrate 210, the damage on the encapsulation film 270 by the folding stress is minimized.

In addition, in the first direction, which may be perpendicular to the extension direction of the folding region FR, since the end of the encapsulation film 270 is disposed to be relatively close to the end of the flexible substrate 210, efficiency of the mother substrate is increased. Namely, since there is no folding stress in the end of the line C-C' in FIG. 3, there is no damage in the encapsulation film 270 even when the end of the encapsulation film 270 has the second distance D2, which is a relatively small, from the end of the flexible substrate 210. In this instance, since the end of the flexible substrate 210 and the end of the encapsulation film 270 is closer, the number of the cells in the direction of the line C-C' can be increased.

Moreover, as explained in FIG. 4A, the encapsulation film 270 has a patterned shape, i.e., an island shape, in each cell of the mother substrate, the damage on the encapsulation film 270 by the scribing process is prevented.

Accordingly, the damage on the emitting diode D by the moisture penetration is prevented, and the production costs of flexible OLED device are reduced.

Figure 7A:
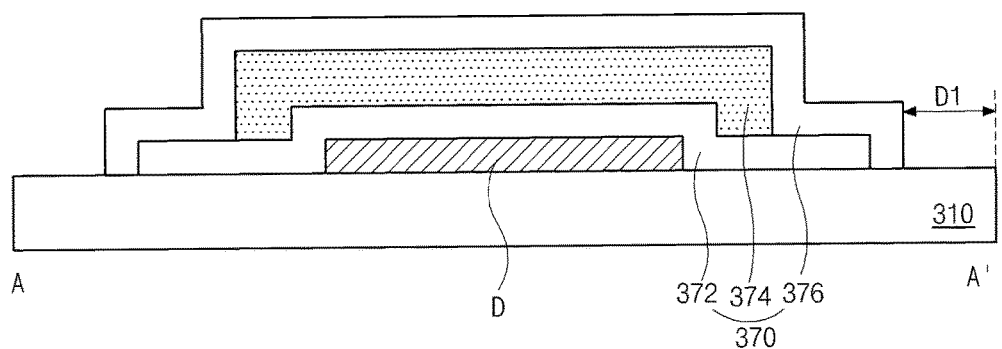
FIGS. 7A and 7B are schematic cross-sectional views illustrating a foldable OLED device according to a third embodiment of the present disclosure.
Figure 7B:
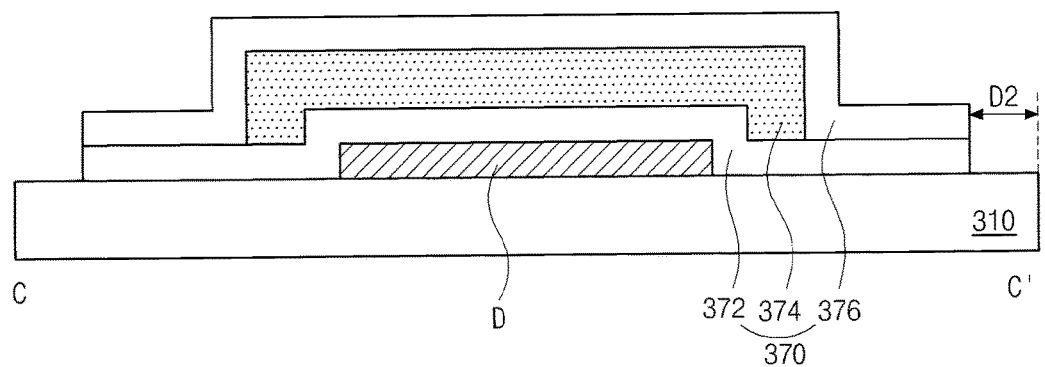

FIGS. 7A and 7B are schematic cross-sectional views illustrating a foldable OLED device according to a third embodiment of the present disclosure. FIG. 7A is a cross-sectional view taken along the line A-A' in FIG. 3, and FIG. 7B is a cross-sectional view taken along the line C-C' in FIG. 3.

As shown in FIGS. 7A and 7B, a flexible OLED device 300 according to the third embodiment of the present disclosure includes the flexible substrate 310, where the display region and the non-display region are defined, the emitting diode D corresponding to the display region and disposed on or over the flexible substrate 310, and the encapsulation film 370 covering the emitting diode D and corresponding to the display region and a part of the non-display region.

For example, the flexible substrate 310 may be a polyimide substrate. The TFT Tr (of FIG. 5), the emitting diode D and the encapsulation film 370 are formed on or over the flexible substrate 310.

As illustrated with FIG. 5, the TFT Tr may include the semiconductor layer 122, the gate electrode 130, the source electrode 140 and the drain electrode 142, and the emitting diode D may include the first electrode 160, which is connected to the drain electrode 142, the second electrode 164, which faces the first electrode 160, and the organic emitting layer 162 between the first and second electrodes 160 and 164.

The encapsulation film 370 covers the emitting diode D and has an area smaller than the flexible substrate 310. Namely, the ends of the encapsulation film 370 are positioned inside the ends of the flexible substrate 310.

In the ends of the folding region FR, the encapsulation film 370 is removed such that one of the passivation layer 150 (of FIG. 5), the interlayer insulating layer 132 (of FIG. 5), the gate insulating layer 124 (of FIG. 5) and the flexible substrate 310 is exposed and the ends of the encapsulation film 370 are disposed on the one of the passivation layer 150, the interlayer insulating layer 132, the gate insulating layer 124 and the flexible substrate 310.

On the other hand, to prevent the damages on the passivation layer 150, the interlayer insulating layer 132 or the gate insulating layer 124 by the scribing process and moisture penetration into the display region, all of the passivation layer 150, the interlayer insulating layer 132 and the gate insulating layer 124 may be removed in the ends of the folding region FR such that the encapsulation film 370 may contact the flexible substrate 310 in the ends of the folding region FR.

The encapsulation film 370 includes a first inorganic layer 372, an organic layer 374 and a second inorganic layer 376. However, it is not limited thereto.

For example, the encapsulation film 370 may further include an organic layer and an inorganic layer on the second inorganic layer 376 to have a five-layered structure.

The organic layer 374 is positioned between the first inorganic layer 372 and second inorganic layer 376. The organic layer 374 has a plane area smaller than the first and second inorganic layers 372 and 376 and completely overlaps the first and second inorganic layers 372 and 376. Namely, the organic layer 374 is completely covered and protected by the second inorganic layer 376 such that moisture penetration through the organic layer 374 is prevented.

For example, when the organic layer 374 has the same plane area as or larger area than the second inorganic layer 376, a side surface of the organic layer 374 is exposed and moisture penetration may be generated through the side surface of the organic layer 374. However, in the present disclosure, since the organic layer 374 is completely covered and protected by the second inorganic layer 376, moisture penetration through the organic layer 374 is prevented.

Each of the first and second inorganic layers 372 and 376 may be formed of silicon oxide or silicon nitride, and the organic layer 374 may be formed of an epoxy compound or an acryl compound.

As shown in FIG. 7A, in the folding region FR, the end of the encapsulation film 370 has a first distance D1 from the flexible substrate 310.

On the other hand, as shown in FIG. 7B, in a side along a direction, which is perpendicular to an extension direction of the folding region FR, the end of the encapsulation film 370 has a second distance D2, which is smaller than the first distance D1, from the flexible substrate 310.

Namely, the encapsulation film 370 has an asymmetric shape such that a distance between the end of the encapsulation film 370 and the end of the flexible substrate 310 is varied with respect to a direction.

In other words, in a direction, where the ends of the folding region FR, in which the folding stress is generated, are disposed, the end of the encapsulation film 370 is positioned to be far away from the end of the flexible substrate 310, the damage on the encapsulation film 370 by the folding stress is minimized.

In addition, in a direction, which may be perpendicular to the extension direction of the folding region FR, since the end of the encapsulation film 370 is disposed to be relatively close to the end of the flexible substrate 310, efficiency of the mother substrate is increased. Namely, since there is no folding stress in the end of the line C-C' in FIG. 3, there is no damage in the encapsulation film 370 even when the end of the encapsulation film 370 has the second distance D2, which is a relatively small, from the end of the flexible substrate 310. In this instance, since the end of the flexible substrate 310 and the end of the encapsulation film 370 is closer, the number of the cells in the direction of the line C-C' can be increased.

Moreover, as shown in FIG. 7A, in a first direction, the second inorganic layer 376 covers a side surface of the first inorganic layer 372. Namely, in the first direction, the second inorganic layer 376 has a width larger than the first inorganic layer 372, and an end of the second inorganic layer 376 contacts an upper surface of the flexible substrate 310. Accordingly, even though the folding stress is concentrated into the encapsulation film 370, the first inorganic layer 372, which is a final-protection element for the emitting diode D, is covered with the second inorganic layer 376 such that the damage on the emitting diode D by moisture penetration can be minimized.

On the other hand, as shown in FIG. 7B, in a second direction, the first and second inorganic layers 272 and 276 have the same width and completely overlap each other. To protect the emitting diode D, the first inorganic layer 372 should have a width being larger than a pre-determined width. In the present invention, since the second inorganic layer 376 in the second direction, where the folding stress is not generated, has the same width as the first inorganic layer 372, an area increase of the non-display region in the second direction can be prevented.

Accordingly, the damage on the emitting diode D by the moisture penetration is prevented, the production costs of the flexible OLED device are reduced, and the flexible OLED device having a narrow bezel is provided.

Figure 8A:
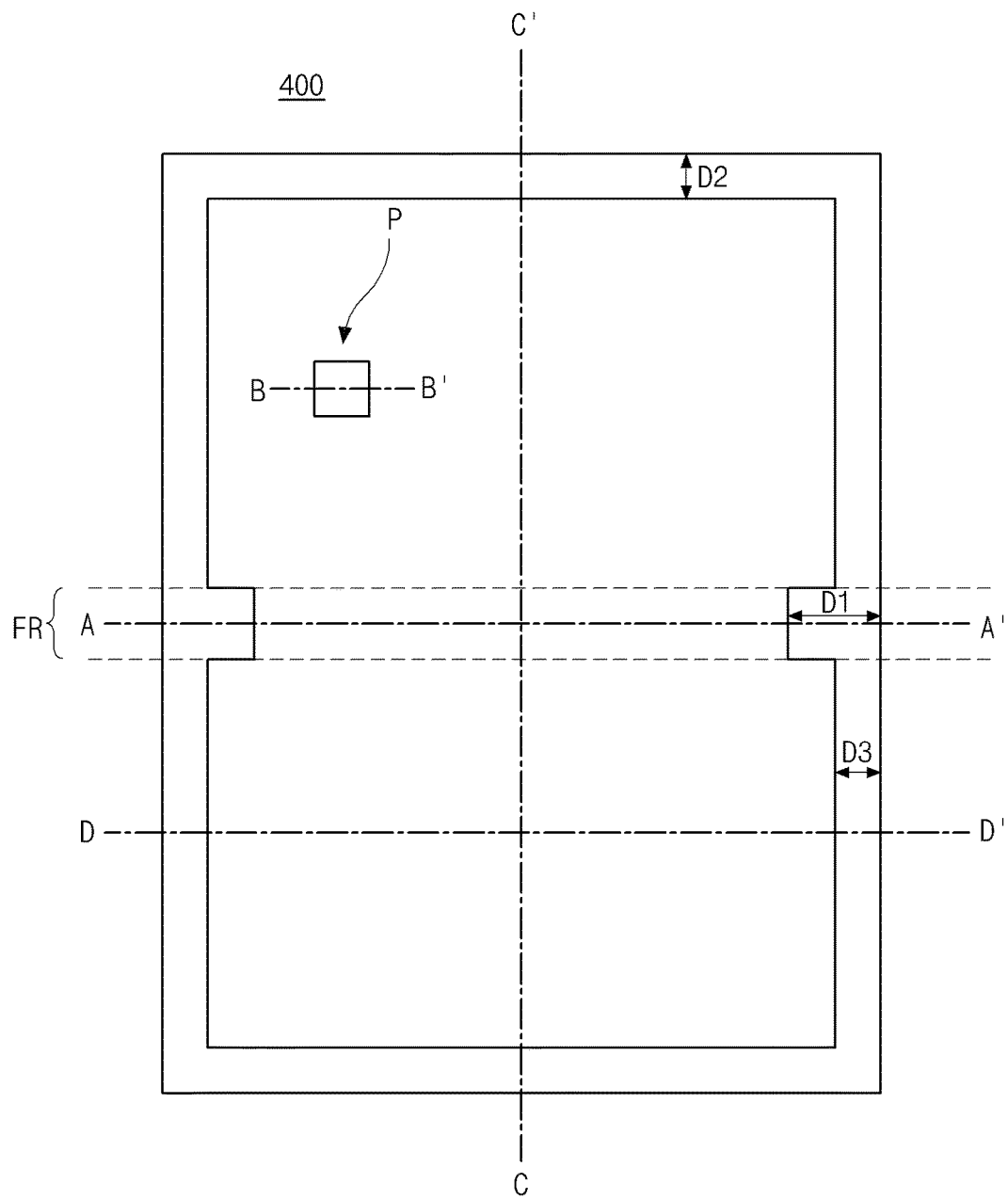
FIGS. 8A to 8D are schematic views illustrating a foldable OLED device according to a fourth embodiment of the present disclosure.
Figure 8B:
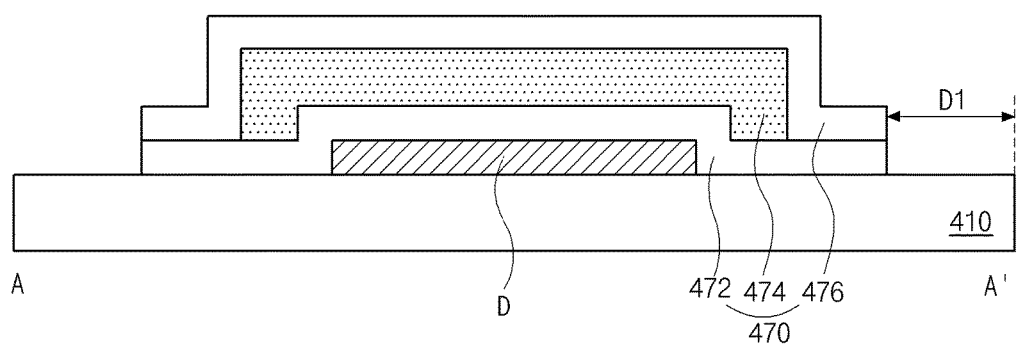
Figure 8C:
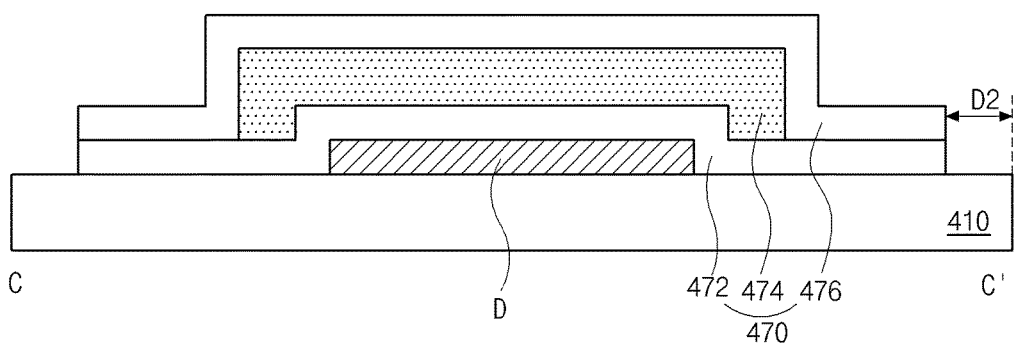
Figure 8D:
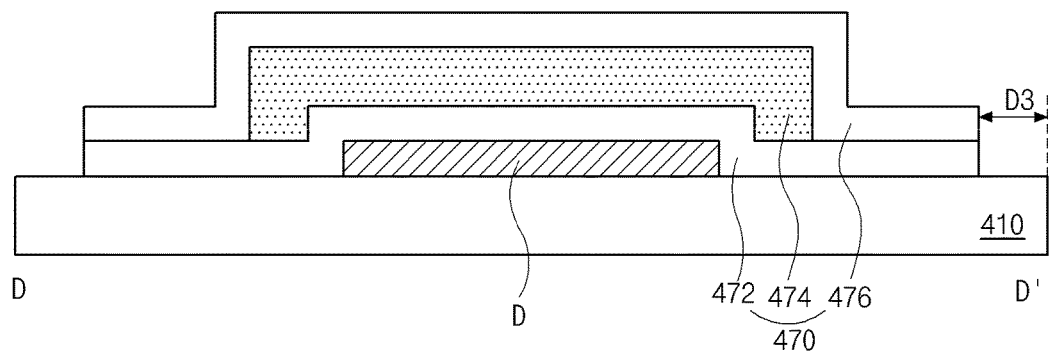

FIGS. 8A to 8D are schematic views illustrating a foldable OLED device according to a fourth embodiment of the present disclosure. FIG. 8A is a schematic plane view of the foldable OLED device, and FIGS. 8B to 8D are schematic cross-sectional views taken along the lines A-A', C-C' and D-D' in FIG. 8A.

As shown in FIGS. 8A to 8D, a flexible OLED device 400 according to the fourth embodiment of the present disclosure includes the flexible substrate 410, where the display region and the non-display region are defined, the emitting diode D corresponding to the display region and disposed on or over the flexible substrate 410, and the encapsulation film 470 covering the emitting diode D and corresponding to the display region and a part of the non-display region.

For example, the flexible substrate 410 may be a polyimide substrate. The TFT Tr (of FIG. 5), the emitting diode D and the encapsulation film 470 are formed on or over the flexible substrate 410.

As illustrated with FIG. 5, the TFT Tr may include the semiconductor layer 122, the gate electrode 130, the source electrode 140 and the drain electrode 142, and the emitting diode D may include the first electrode 160, which is connected to the drain electrode 142, the second electrode 164, which faces the first electrode 160, and the organic emitting layer 162 between the first and second electrodes 160 and 164.

The encapsulation film 470 covers the emitting diode D and has an area smaller than the flexible substrate 410. Namely, the ends of the encapsulation film 470 are positioned inside the ends of the flexible substrate 410.

In the ends of the folding region FR, the encapsulation film 470 is removed such that one of the passivation layer 150 (of FIG. 5), the interlayer insulating layer 132 (of FIG. 5), the gate insulating layer 124 (of FIG. 5) and the flexible substrate 410 is exposed and the ends of the encapsulation film 470 are disposed on the one of the passivation layer 150, the interlayer insulating layer 132, the gate insulating layer 124 and the flexible substrate 410.

On the other hand, to prevent damage on the passivation layer 150, the interlayer insulating layer 132, or the gate insulating layer 124 by the scribing process and moisture penetration into the display region, all of the passivation layer 150, the interlayer insulating layer 132 and the gate insulating layer 124 may be removed in the ends of the folding region FR such that the encapsulation film 470 may contact the flexible substrate 410 in the ends of the folding region FR.

The encapsulation film 470 includes a first inorganic layer 472, an organic layer 474 and a second inorganic layer 476. However, it is not limited thereto.

For example, the encapsulation film 470 may further include an organic layer and an inorganic layer on the second inorganic layer 476 to have a five-layered structure.

The first and second inorganic layers 472 and 476 have the same plane area and completely overlap each other.

Alternatively, as shown in FIGS. 8B and 8C, in a first direction, i.e., an extension direction of the folding region FR, the second inorganic layer 476 may cover a side surface of the first inorganic layer 472 (FIG. 8B), and in a second direction, which may be perpendicular to the first direction, the second inorganic layer 476 may have the same width as the first inorganic layer 472 to completely overlap each other (FIG. 8C). As a result, the damage on the emitting diode D by moisture penetration in the folding region FR and an area increase of the non-display region in the second direction can be prevented.

The organic layer 474 is positioned between the first inorganic layer 472 and second inorganic layer 476. The organic layer 474 has a plane area smaller than the first and second inorganic layers 472 and 476 and is completely overlapped by the first and second inorganic layers 472 and 476. Namely, the organic layer 474 is completely covered and protected by the second inorganic layer 476 such that moisture penetration through the organic layer 474 is prevented.

For example, when the organic layer 474 has the same plane area as or larger area than the second inorganic layer 476, a side surface of the organic layer 474 is exposed and moisture penetration may be generated through the side surface of the organic layer 474. However, in the present disclosure, since the organic layer 474 is completely covered and protected by the second inorganic layer 476, moisture penetration through the organic layer 474 is prevented.

Each of the first inorganic layer 472 and second inorganic layer 476 may be formed of silicon oxide or silicon nitride, and the organic layer 474 may be formed of an epoxy compound or an acryl compound.

As shown in FIG. 8B, in the folding region FR (of FIG. 8A), the end of the encapsulation film 470 has a first distance D1 from the flexible substrate 410.

On the other hand, as shown in FIG. 8C, in a side along a second direction, which is perpendicular to an extension direction (i.e., a first direction) of the folding region FR, the end of the encapsulation film 470 has a second distance D2, which is smaller than the first distance D1, from the flexible substrate 410.

In addition, as shown in FIG. 8D, in a unfolding region, which is a region in the first direction except the folding region FR (of FIG. 8A), the end of the encapsulation film 470 has a third distance D3, which is smaller than the first distance D1, from the end of the flexible substrate 410. The third distance D3 may be equal to or different from the second distance D2.

In the ends of the folding region FR, the end of the encapsulation film 470 is positioned to be far away from the end of the flexible substrate 410 such that the damage on the encapsulation film 470 by the folding stress is minimized.

In addition, in the second direction, which may be perpendicular to the extension direction of the folding region FR, since the end of the encapsulation film 470 is disposed to be relatively close to the end of the flexible substrate 410, efficiency of the mother substrate is increased.

Moreover, in the ends of the unfolding region in the first direction, a width of the encapsulation film 470 is increased in comparison to the folding region (FR) such that moisture penetration is minimized.

Further, as explained in FIG. 4A, the encapsulation film 470 has a patterned shape, i.e., an island shape, in each cell of the mother substrate, the damage on the encapsulation film 470 by the scribing process is prevented.

Accordingly, the damage on the emitting diode D by the moisture penetration is prevented, and the production costs of flexible OLED device are reduced.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A foldable organic light emitting display (OLED) device, comprising:
   a substrate including a display region and a non-display region, the non-display region located at a periphery of the display region;
   an emitting diode in the display region; and
   an encapsulation film covering both the emitting diode and an entirety of the display region, and the encapsulation film covering a part of the non-display region,
   wherein an end of the encapsulation film in a first portion of a first side of the encapsulation film has a first distance from an end of the substrate, and an end of the encapsulation film in a second portion of the first side of the encapsulation film has a second distance from an end of the substrate, and wherein the second distance is less than the first distance.

2. The foldable OLED device according to claim 1, wherein the encapsulation film includes a first inorganic layer covering the emitting diode, an organic layer on the first inorganic layer, and a second inorganic layer covering the organic layer.

3. The foldable OLED device according to claim 2, wherein in the first side, the second inorganic layer is wider than the first inorganic layer and covers side surfaces of the first inorganic layer.

4. The foldable OLED device according to claim 3, wherein in a second side that is perpendicular to the first side, a width of the second inorganic layer is substantially the same as a width of the first inorganic layer.

5. The foldable OLED device according to claim 3, wherein in a second side that is perpendicular to the first side, an end of the encapsulation film has a third distance being equal to the first distance.

6. The foldable OLED device according to claim 1, wherein the substrate further includes a folding region corresponding to the first portion, and the foldable OLED device is foldable in the folding region.

7. A foldable organic light emitting display (OLED) device, comprising:
   a substrate including a display region and a non-display region, the non-display region located at a periphery of the display region;
   an emitting diode in the display region; and
   an encapsulation film covering both the emitting diode and an entirety of the display region, and the encapsulation film covering a part of the non-display region,
   wherein the encapsulation film in a first portion of a first side of the encapsulation film has a first width, and the encapsulation film in a second portion of the first side of the encapsulation film has a second width, and wherein the first width is less than the second width.

8. The foldable OLED device according to claim 7, wherein the encapsulation film includes a first inorganic layer covering the emitting diode, an organic layer on the first inorganic layer, and a second inorganic layer covering the organic layer.

9. The foldable OLED device according to claim 8, wherein in the first side, the second inorganic layer is wider than the first inorganic layer and covers side surfaces of the first inorganic layer.

10. The foldable OLED device according to claim 9, wherein in a second side that is perpendicular to the first side, a width of the second inorganic layer is substantially the same as a width of the first inorganic layer.

11. The foldable OLED device according to claim 7, wherein the substrate further includes a folding region corresponding to the first portion, and the foldable OLED device is foldable in the folding region.

* * * * *